(12) United States Patent (10) Patent No.: US 8,276,866 B2
Pirovano et al. (45) Date of Patent: Oct. 2, 2012

(54) ADJUSTABLE CLIPS FOR GRAZING-INCIDENCE COLLECTORS

(75) Inventors: Giorgio Pirovano, Galbiate (IT); Riccardo Ghislanzoni, Ballabio (IT); Jacques Kools, Simane-Collongue (FR)

(73) Assignee: Media Lario, S.R.L., Bosisio Parini (IT)

( * ) Notice: Subject to any disclaimer, the term of this patent is extended or adjusted under 35 U.S.C. 154(b) by 337 days.

(21) Appl. No.: 12/660,955

(22) Filed: Mar. 8, 2010

(65) Prior Publication Data

US 2011/0216395 A1 Sep. 8, 2011

(51) Int. Cl.
*B23P 11/00* (2006.01)
*G03B 27/54* (2006.01)
(52) U.S. Cl. .................... 248/316.5; 248/229.33; 355/67
(58) Field of Classification Search ............... 248/201, 248/205.1, 291.1, 220.21, 229.2, 229.23, 248/309.1, 310, 316.1, 316.5, 316.7, 475.1, 248/476, 488; 250/503.1; 355/67; 378/34, 378/204–207, 210, 147–153
See application file for complete search history.

(56) References Cited

U.S. PATENT DOCUMENTS

| 5,334,354 | A | * | 8/1994 | Johnston et al. ............... 422/560 |
| 2011/0128513 | A1 | * | 6/2011 | Pedrali et al. .................... 355/30 |
| 2011/0181860 | A1 | * | 7/2011 | Hill et al. ......................... 355/71 |
| 2011/0205506 | A1 | * | 8/2011 | Bianucci et al. ................. 355/30 |

* cited by examiner

*Primary Examiner* — Mark Consilvio
(74) *Attorney, Agent, or Firm* — Opticus IP Law PLLC (57) ABSTRACT

An adjustable clip for securing a grazing-incident collector (GIC) shell to a spider having spokes is disclosed. The clip includes a base adapted to be secured to a spider spoke and having an upper surface. The clip includes a fork member having two prongs each with end pads at respective prong ends, and having a first hinge portion at an end opposite the prong ends. A hinge leaf is secured to the base upper surface and has a second hinge portion that operably engages the first hinge portion, thereby forming a hinge that allows for rotatable adjustment of the fork member relative to the base. Movement of the GIC shell when performing optical alignment is accommodated by the clip self-adjusting by its end pads moving over the GIC shell outer surface. When GIC shell alignment is achieved, the end pads are secured to the GIC shell outer surface, thereby turning the clip into a rigid support member that secures the GIC shell in place relative to the spider.

15 Claims, 8 Drawing Sheets

ADJUSTABLE CLIPS FOR GRAZING-INCIDENCE COLLECTORS

FIELD OF THE INVENTION

The present invention relates generally to grazing-incidence collectors (GICs), and in particular to adjustable clips used to secure a GIC shell to a spider.

BACKGROUND ART

EUV lithography is anticipated to be the lithographic process of choice for producing future generations of semiconductor devices having linewidths on the order of 32 nm and smaller. The wavelength of the EUV radiation is nominally 13.5 nm, which calls for the use of specialized optics to collect and image the EUV radiation.

One type of EUV optical system used to collect the radiation from the light source is a grazing-incidence collector (GIC). A GIC typically comprises one or more concentrically arranged GIC shell mirrors ("GIC shells"). The GIC shells are configured to receive light from the EUV source at grazing incidence and reflect the light to form a focused illumination beam that first forms an intermediate focus and then creates an illumination region in the far field that is preferably uniform to within a specification set by the overall system optical design.

GICs typically require a "spider" that maintains the GIC shells in a secured position relative to one another. In some GICs, the GIC shells are secured to the spider using clips that engage the edge or outer surface of the shell and one of the spider spokes. To date, such clips have minimal or no adjustability, which makes optically aligning or adjusting the GIC shells problematic.

SUMMARY OF THE INVENTION

An aspect of the invention is an adjustable clip for securing a grazing-incident collector (GIC) shell to a spider having spokes. The adjustable clip includes a base having an upper surface, wherein the base is adapted to be secured to the spoke of the spider. The clip includes a fork member having two prongs each with end pads at respective prong ends. The fork member has, at an opposite end of the prong ends, a first hinge portion. The clip includes a hinge leaf. The hinge leaf is secured to the upper surface of the base and has a second hinge portion that operably engages the first hinge portion to form a hinge that allows for rotatable adjustment of the fork member relative to the base. Alternatively, the base includes the second hinge portion formed integrally therewith. Movement of the GIC shell when performing optical alignment is accommodated by the rotation of the fork member, which allows the end pads to slide over the outer surface of the GIC shell. When GIC shell alignment is achieved, the end pads are laser welded to outer surface of the GIC shell, which fixes the clip in a rigid configuration that holds the GIC shell in place relative to the spider.

Another aspect of the invention is a method of aligning and securing a GIC shell having an outer surface and an edge to a spider having spokes each with an upper edge. The method includes arranging the GIC shell on the spider, with the edge resting on portions of the upper edges of the spokes. The method also includes securing a base portion of an adjustable clip to one of the upper edges of the spokes. The method further includes securing a fork member to the base portion so that the fork member can rotate relative thereto, with the fork member having end pads that rest against the outer GIC shell. The method then includes optically aligning the GIC shell relative to the spider, which includes, for example, moving the GIC shell so that the fork member rotates and the end pads move relative to the outer surface of the GIC shell. The method then includes securing the end pads(e.g., via laser welding) to the outer surface of the GIC shell so that the adjustable clip becomes a rigid support member. Typically, a number of adjustable clips, such as three or more, are used to secure each GIC shell to the spider.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description present embodiments of the invention, and are intended to provide an overview or framework for understanding the nature and character of the invention as it is claimed. The accompanying drawings are included to provide a further understanding of the invention, and are incorporated into and constitute a part of this specification. The drawings illustrate various embodiments of the invention and together with the description serve to explain the principles and operations of the invention.

BRIEF DESCRIPTION OF THE DRAWINGS

FIG. 5A and FIG. 5B are close-up perspective views of an example adjustable clip as secured to one of the spokes of the spider and supporting the outer surface of a GIC shell, wherein FIG. 5A illustrates laser welding of the hinge leaf to the base and FIG. 5B shows laser welding of the fork member end pads to the GIC shell outer surface;

The various elements depicted in the drawing are merely representational and are not necessarily drawn to scale. Certain sections thereof may be exaggerated, while others may be minimized. For ease of illustration, not all like elements are necessarily labeled. The drawing is intended to illustrate an example embodiment of the invention that can be understood and appropriately carried out by those of ordinary skill in the art.

DETAILED DESCRIPTION

Figure 1:
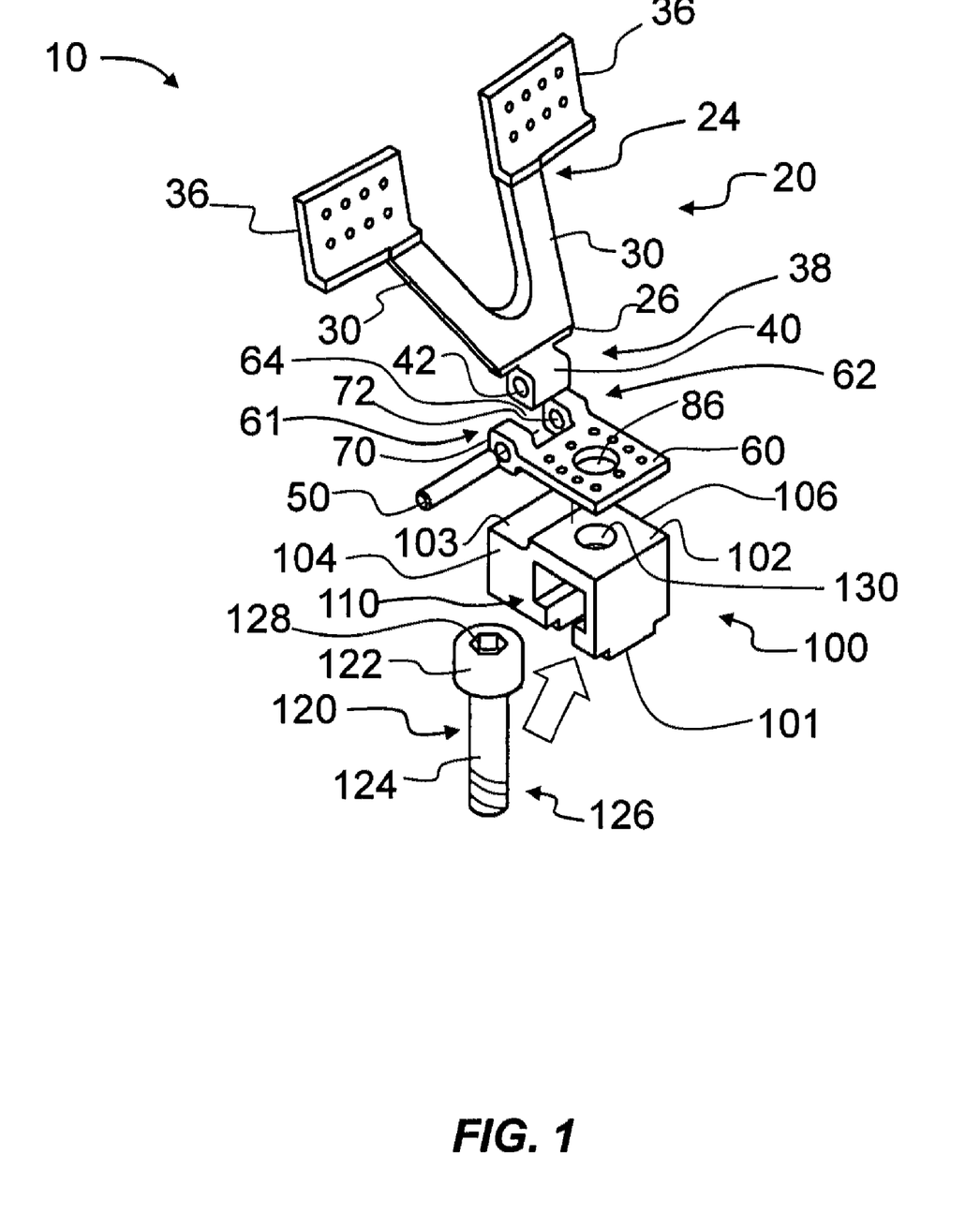
FIG. 1 is a perspective exploded view of an example adjustable clip, also showing the set screw used to secure the clip to a spider spoke.
Figure 2:
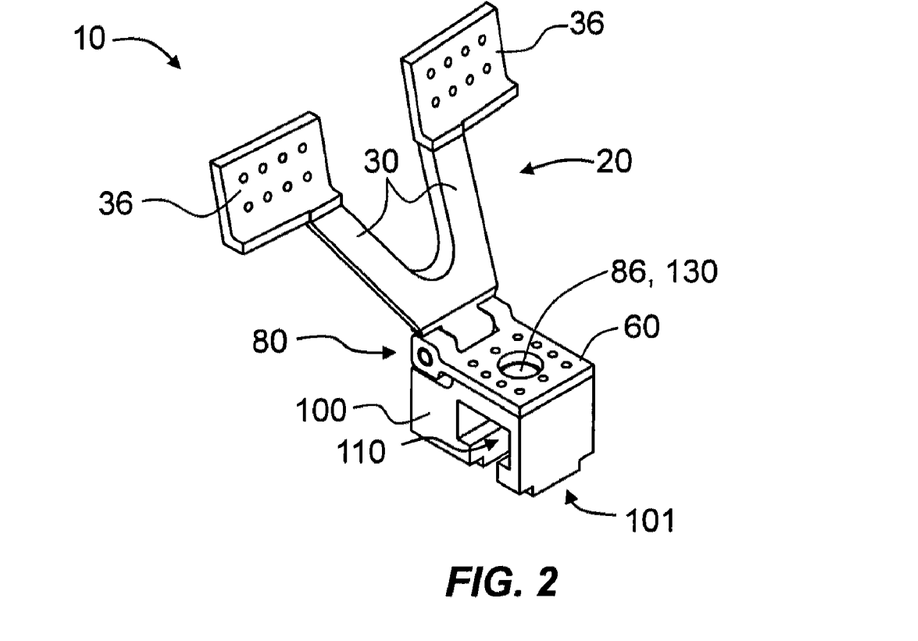
FIG. 2 is a perspective view of the assembled adjustable clip of FIG. 1.

FIG. 1 is a perspective exploded view of an example adjustable clip ("clip") 10 according to the present invention, also showing a set screw 120. FIG. 2 is a perspective view of the assembled clip 10 of FIG. 1. Clip 10 includes a fork member 20 with two prongs 30 each having an end 24 with an end pad 36. In an example embodiment, fork member 20 and end pads 36 are rigid or substantially so. Example materials for clip 10 include stainless steel, Inconel, Aluminum, Nickel or Nickel alloy for thermal compatibility with electroformed GIC shells.

Fork member 20 also has an opposite end 26 that includes a first hinge portion 38 that by way of example comprises a hinge knuckle 40. Hinge knuckle 40 has a hole 42 sized to accommodate a pin 50.

Figure 3:
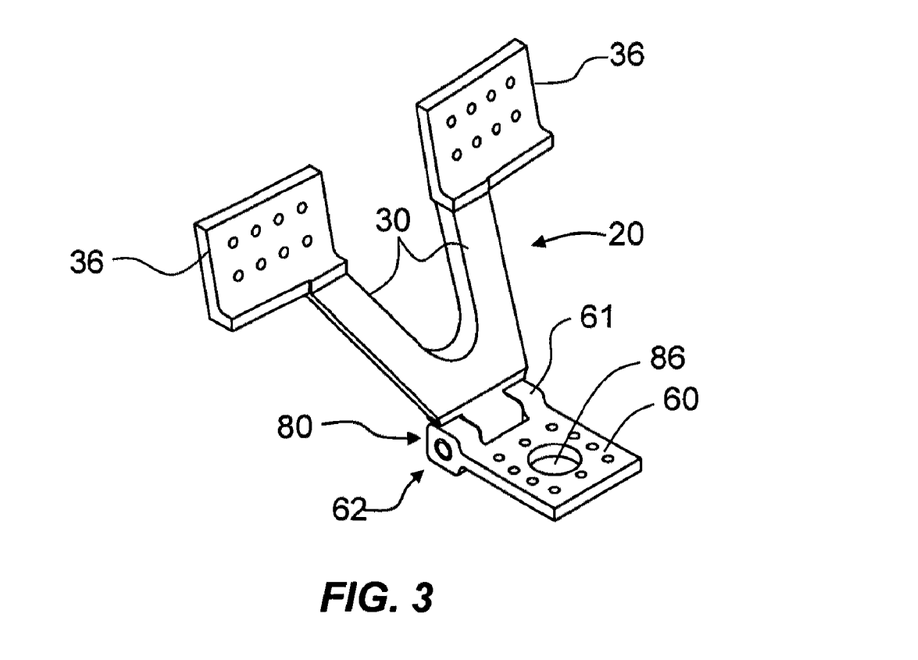
FIG. 3 is a perspective view of the fork member and hinge leaf.

With reference also to FIG. 3, an example of clip 10 includes a hinge leaf 60 with a second hinge portion 61 at an edge 62. Edge 62 includes an indent 64 that defines outside hinge knuckles 70 having respective holes 72 formed therein and sized to accommodate pin 50. Indent 64 is sized to accommodate hinge knuckle 40 so that hinge leaf 60, hinge knuckle 40 and pin 50(or more generally, the first and second hinge portions 38 and 61, and pin 50 passing therethrough) form a hinge 80 that allows for fork member 20 to rotate, thereby allowing for rotatable adjustability of the fork member 20. Hinge leaf 60 also includes a central access hole 86 for accessing a screwing feature 128 of a set screw 120, as described below.

Clip 10 further includes a base 100 having an upper surface 102 and opposite side surfaces 104 and 106. A set screw 120 with a screw head 122 having a screwing feature 128 (shown as an Allen-type feature) is shown adjacent base 100. Set screw 120 also includes a shaft 124 with a threaded end 126. Base 100 includes a slot 110 having a cross-sectional shape that accommodates screw head 122 and a portion of shaft 124 (i.e., the head shank) adjacent thereto. Upper surface 102 of base 100 includes a central hole 130 in that reaches slot 110. In an example embodiment, upper surface 102 of base 100 also includes a ledge 103 that accommodates outside hinge knuckles 70.

Hinge leaf 60 is secured to base 100 so that holes 86 and 130 are aligned so that when set screw 120 is slid into slot 110, screwing feature 128 can be accessed through the hinge leaf 60 and the base 100 from above.

In another example embodiment, second hinge portion 61 is formed integrally with base 100, thereby obviating the need for a separate hinge leaf 60 to be secured to base upper surface 102.

In some instances, clips 10 with two prongs 30 cannot be used in certain locations due to mechanical interference with other elements. To avoid mechanical interference, in some locations, clips with one prong 30 may be employed. A single-prong clip 10 is not as stiff in the circumferential direction as the two-prong clip and is not recommended for sustaining lateral loads. However, this embodiment is acceptable when is used in appropriate combination with two-prong clips 10 where the latter absorb lateral loads.

Spider and Clips

Figure 4:
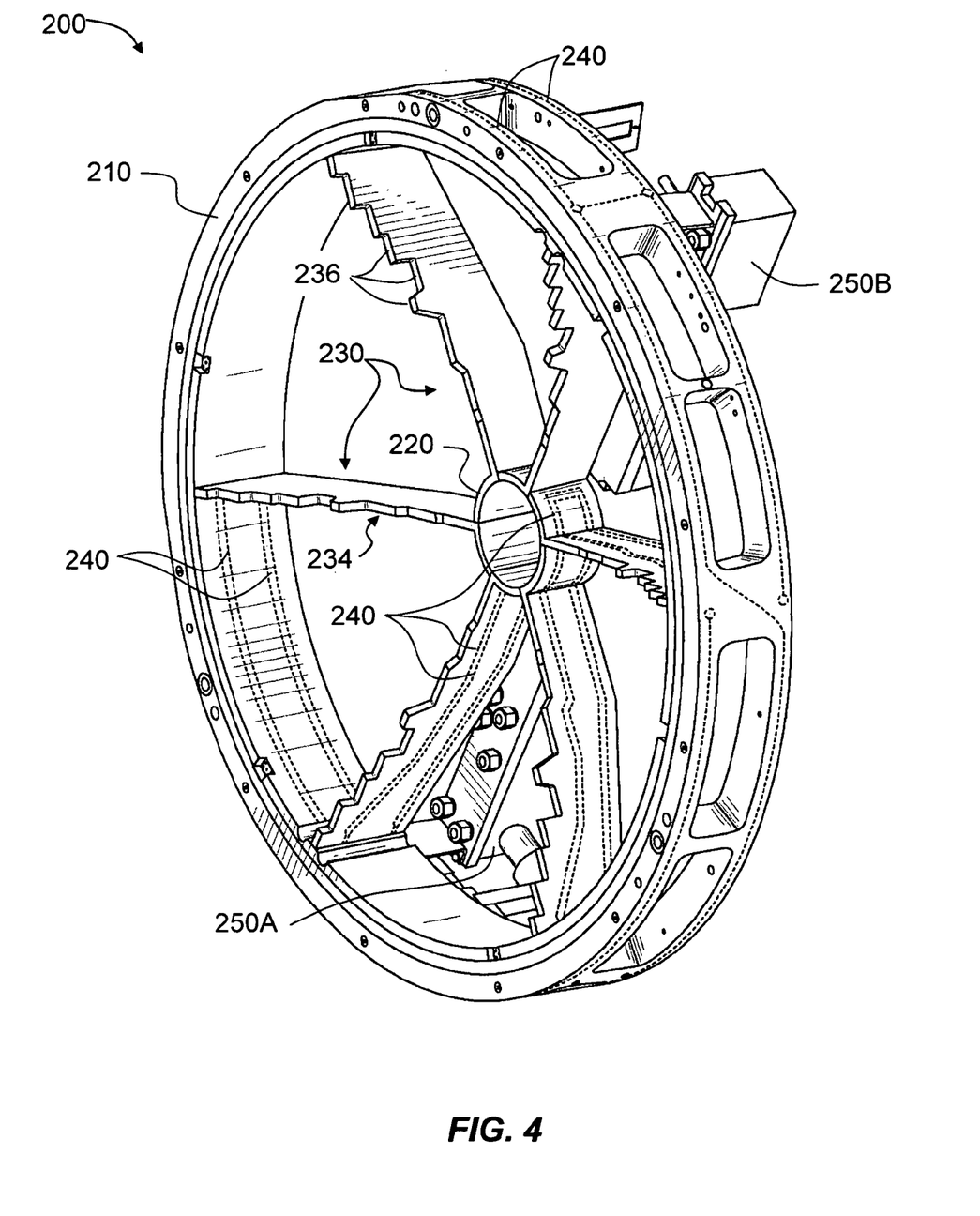
FIG. 4 is a perspective view of an example spider used to form a GIC mirror having one or more GIC shells.

FIG. 4 is a perspective view of an example spider 200 such as described in U.S. patent application Ser. No. 12/657,650, entitled "Cooled spider and method for grazing incidence collector," which Application is incorporated by reference herein. A main function of spider 200 is to provide precise, sturdy mounting and mechanical rigidity to the assembly of one or more GIC shells 300 (which are introduced and discussed below) that form a GIC mirror. An example material for forming spider 200 is stainless steel. Other materials include Inconel, Aluminum, Nickel or Nickel alloy for thermal compatibility with electroformed GIC shells 300.

Spider 200 includes an outer ring 210, an inner ring 220, and a plurality of spokes 230 (six are shown by way of illustration) that mechanically connect the inner and outer rings to provide structural support to the spider. In an example where spider 200 is a cooled spider, outer ring 210, inner ring 220, and plurality of spokes 230 are fluidly connected by cooling channels 240 that are fluidly connected to input and output cooling fluid manifolds 250A and 250B, thereby forming a cooling fluid flow path through the spider.

Spokes 230 each include a spoke edge 234 configured to support two or more GIC shells 300 in a spaced apart configuration. In an example embodiment, spoke edge 234 includes a number of steps 236 that are used to support clips 10 as well as GIC shells 300 at edge 304 of the GIC shell 300, as show in FIGS. 5A and 5B.

Figure 5A:
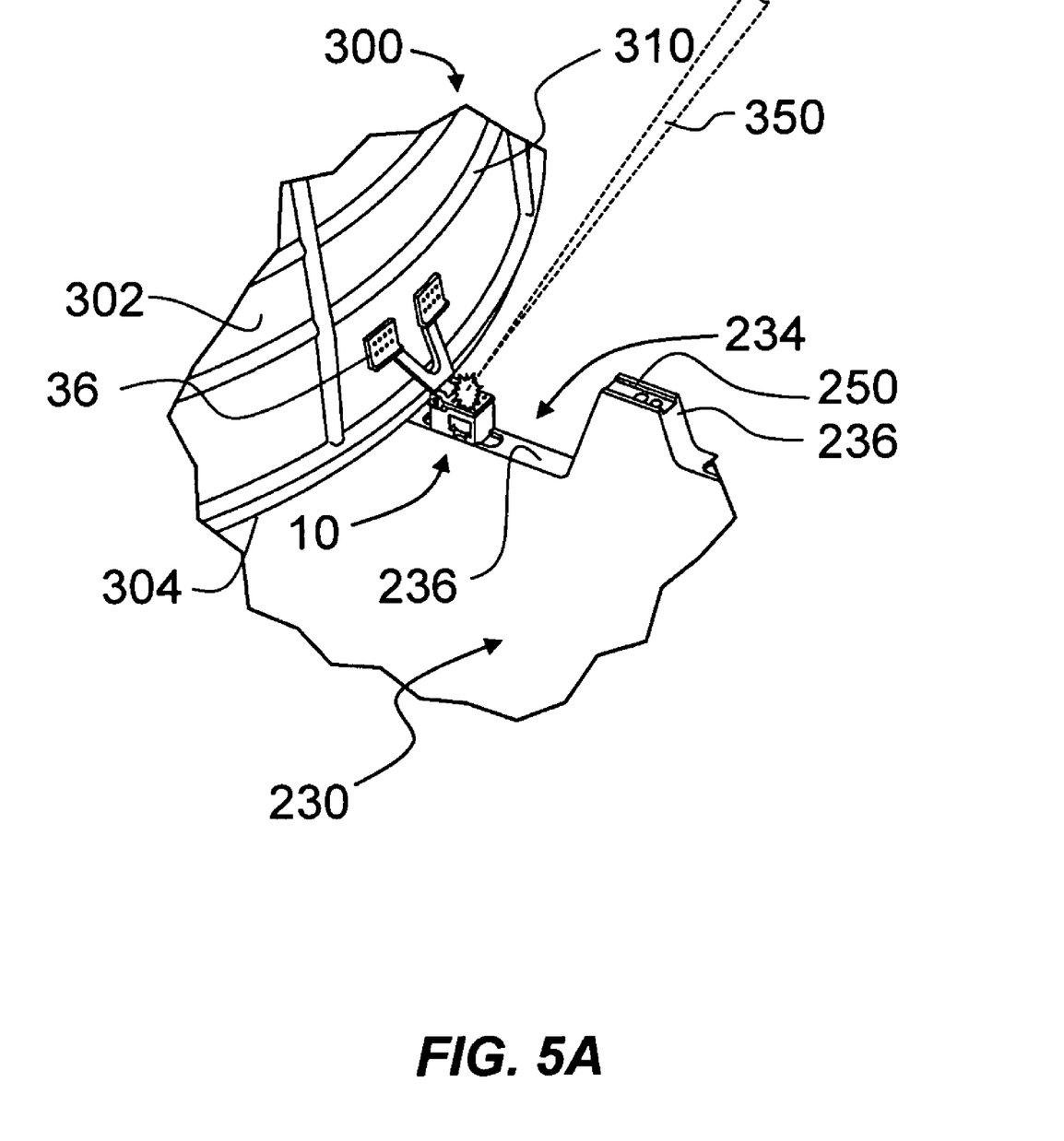
Figure 5B:
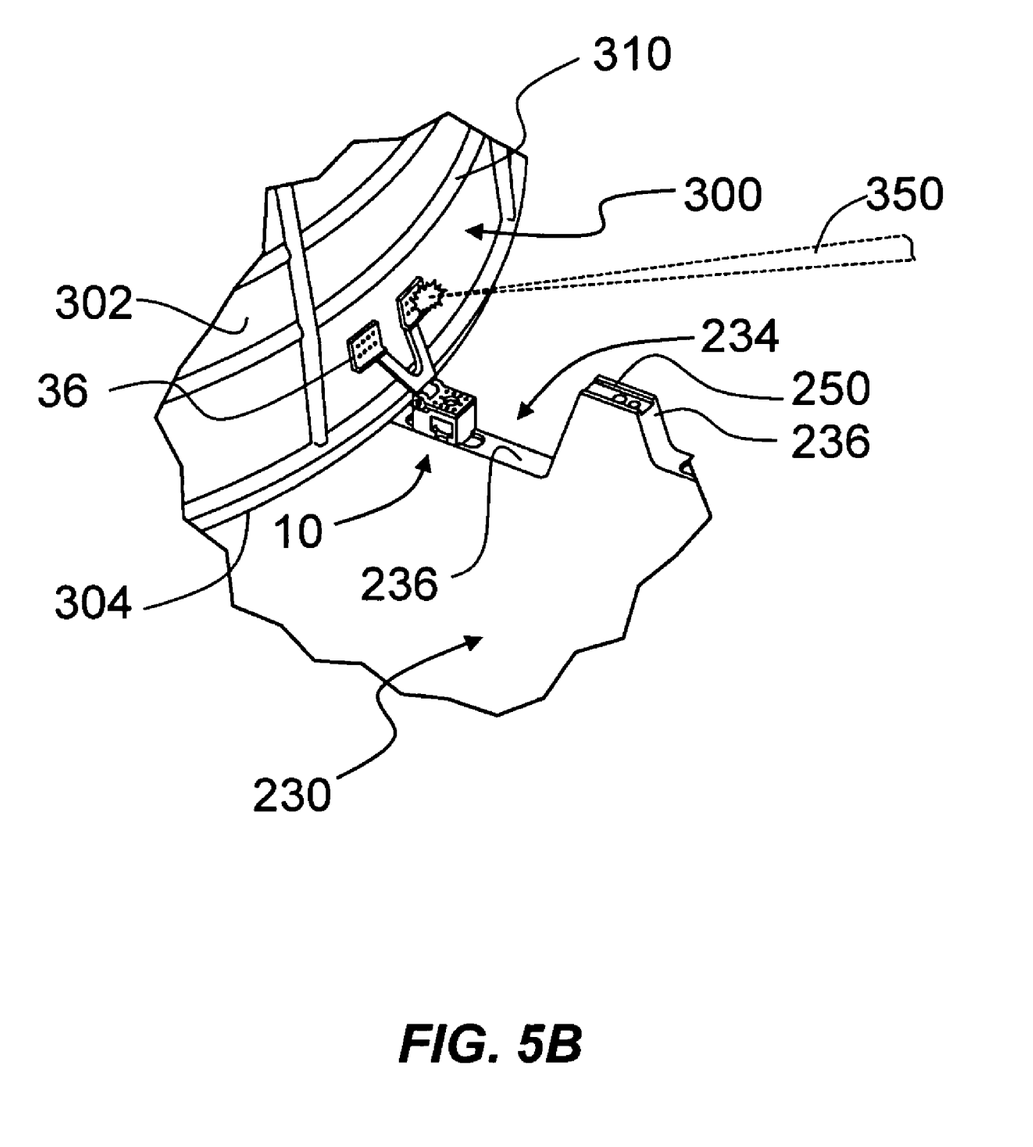

FIG. 5A and FIG. 5B are close up views of clip 10 as arranged in an operable configuration relative to spider 200 and a GIC shell 300, which has an outer surface 302 and an edge 304. Cooling lines 310 are also shown arranged adjacent outer surface 302 of the GIC shell 300. Set screw 120 is slid into slot 110 and used to mount base 100 to a step 236. Shown on one of steps 236 is an example mounting track 250 onto which base 100 can be mounted and movably adjusted along the mounting track 250 prior to being locked in place with set screw 120 or other securing means. In an example embodiment, base 100 has a lower surface 101 configured to slide along mounting track 250.

When base 100 is secured to step 236, fork member 20 is adjusted so that end pads 36 rest against outer surface 302 of GIC shell 300. However, fork member 20 rotates around hinge 80 so that the position of GIC shell 300 relative to spider 200 can be moved, e.g., for optical alignment of the GIC shell 300, while end pads 36 continue to rest against outer surface 302 of GIC shell 300. In particular, when adjusting the position of GIC shell 300 relative to spider 200, end pads 36 move relative to (e.g., slide over) outer surface 302 of GIC shell 300.

When GIC shell 300 is optically aligned, then as shown in FIG. 5A, in one embodiment hinge leaf 60 is secured (e.g., laser welded) to upper surface 102 of base 100 using a laser beam 350. This step is obviated when hinge portion 61 is already formed integrally with base 100.

Also, as shown in FIG. 5B, fork member 20 is secured to GIC shell outer surface 302, e.g., by laser welding end pads 36 to the GIC outer surface with laser beam 350. Securing end pads 36 to GIC shell outer surface stiffens clip 10 (i.e., fork member is no longer able to rotate) so that the clip serves as a rigid support that secures GIC shell 300 to spider 200 in an aligned configuration. Typically, multiple adjustable clips 10 are used to align and secure GIC shell 300 to spider 200.

Spider with GIC Shells

Figure 6A:
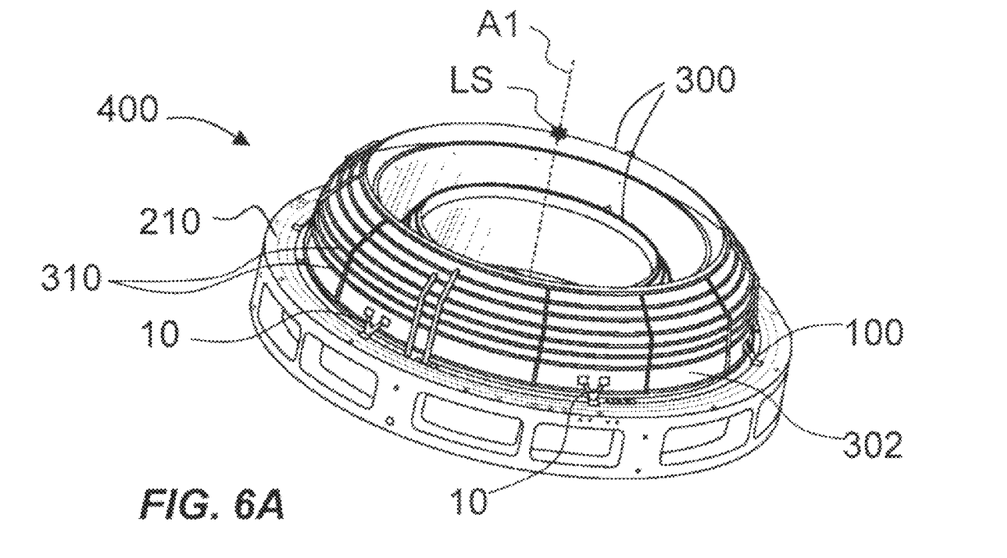
FIG. 6A is a perspective view of an example embodiment of a GIC mirror having nine GIC shells shown in the process of being assembled using the spider of FIG. 4, and showing several of the adjustable clips positioned to support the outermost shell shown.
Figure 6B:
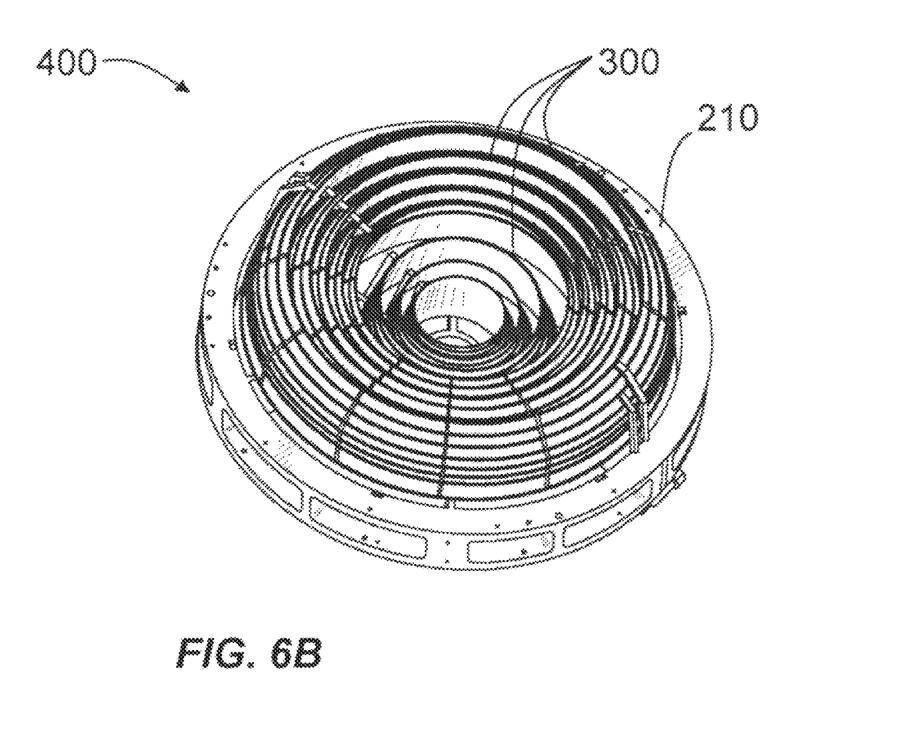
FIG. 6B is a perspective view of the GIC mirror of FIG. 6A, but with all nine GIC shells in position.

FIG. 6A is a perspective view of spider 200 supporting two GIC shells 300 in the process forming a GIC mirror 400 having nine GIC shells 300, as shown in FIG. 6B. GIC mirror 400 has an optical axis A1. An example GIC shell 300 includes the aforementioned cooling lines 310 arranged on outer surface 302, as described in U.S. patent application Ser. No. 12/592,735, which application is incorporated by reference herein.

An EUV light source LS is also shown as arranged along optical axis A1 and relative to GIC mirror 400. Spider 200 is configured to operably support one or more GIC shells 300 in a spaced-apart and concentric configuration while not substantially blocking EUV radiation from being relayed from EUV light source LS to a GIC mirror intermediate focus.

In forming the GIC mirror 400, the innermost GIC shell 300 is arranged on spider 200 with the edge 304 placed on the corresponding inner steps 236 of spokes 230. Steps 236 support GIC shell 300 at respective portions of the edge 304. Other GIC shells 300 are then added from the inside direction to the outside direction until the completed GIC mirror 400 is formed, as shown in FIG. 6B.

Example GIC Shell Alignment and Securing Method

Figure 7:
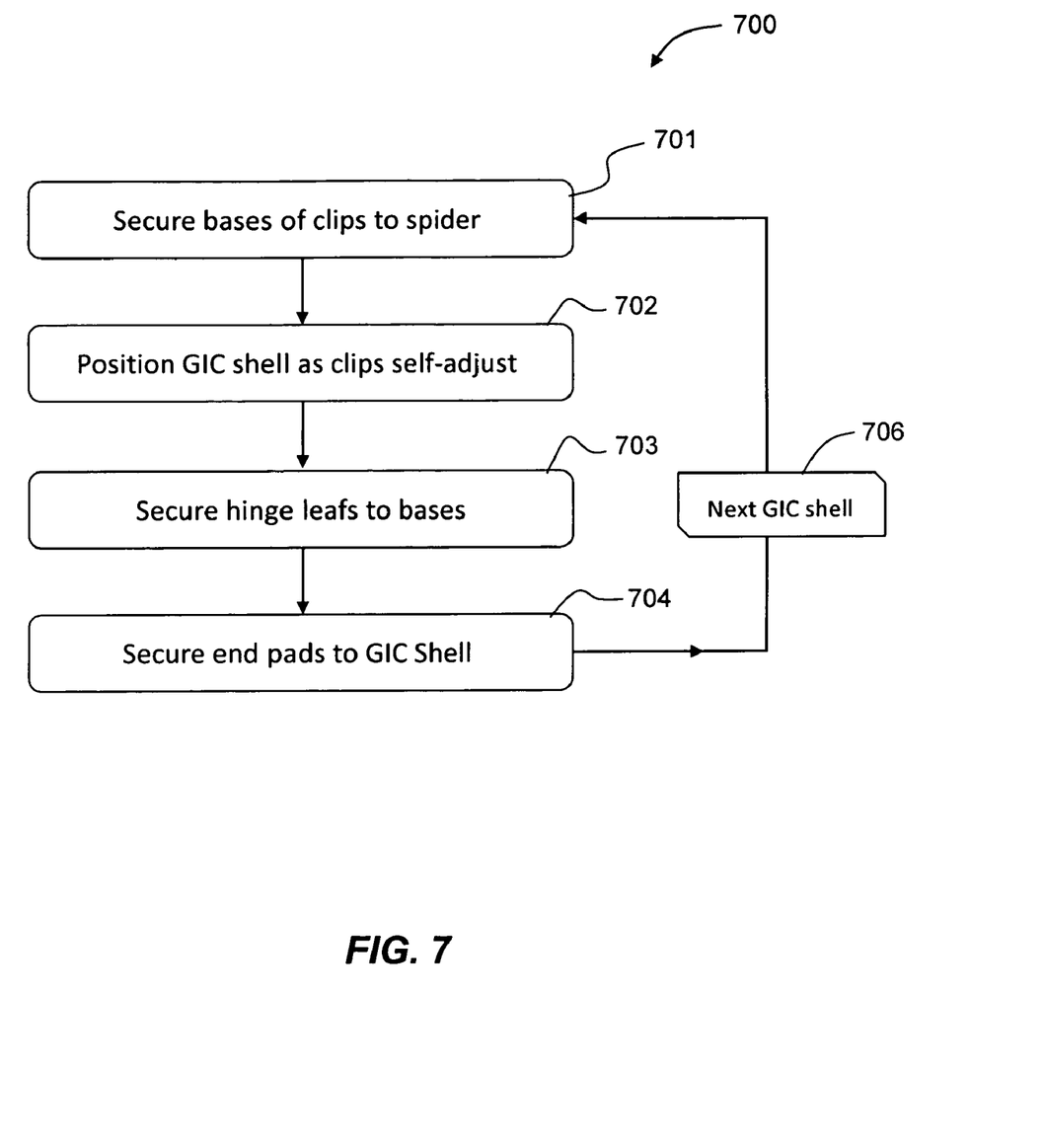
FIG. 7 is a flow diagram of an example method for aligning and securing one or more GIC shells to a spider in forming a GIC mirror.

FIG. 7 is a flow diagram of an example method for aligning and securing one or more GIC shells 300 to spider 200 in forming a GIC mirror 500.

In 701, the base 100 of a clip 10 is secured (e.g., screwed) onto spider 200 at one of the innermost steps 236 of spokes 230. In an example, this is done for at least three clips 10.

In 702, GIC shell 300 is positioned (e.g., aligned) relative to spider 200, and during this positioning, clips 10 "self-adjust" by fork members 20 rotating relative to their respective bases 100 at their respective hinges 80. Once GIC shell 300 is in an optically aligned position on spider 200, then in 703, hinge leafs 60 are laser welded to their respective bases 100. Then in 704, end pads 36 are laser welded to GIC shell outer surface 302, whereby clips 10 become rigid support members.

In the aforementioned embodiment where second hinge portion 61 is formed integrally with base 100, step 702 is eliminated.

In 705, the next outermost GIC shell 300 is arranged on spider 200 on the next outermost steps 236, and process 700 is repeated in the direction from the innermost GIC shell 300 to the outermost GIC shell 300 until GIC mirror 400 is formed (see 706), such as shown in FIG. 6A and FIG. 6B.

Clip with Actuator Mechanism

In an additional aspect of the present invention, the use of one or more clips 10 allow for optimization of the optical performance of GIC mirror 400, not only by self-adjustment of the clips 10 as described above, but also through controlled manipulation of at least one of the shape (via stressing and deformation), the orientation, and the position (via translation and rotation) of the GIC shell 300. Such controlled manipulation is beneficial as it allows to correct for astigmatism (i.e., deviations of perfect cylindrical symmetry), or to correct orientation and placement errors of the GIC shell 300.

Figure 8:
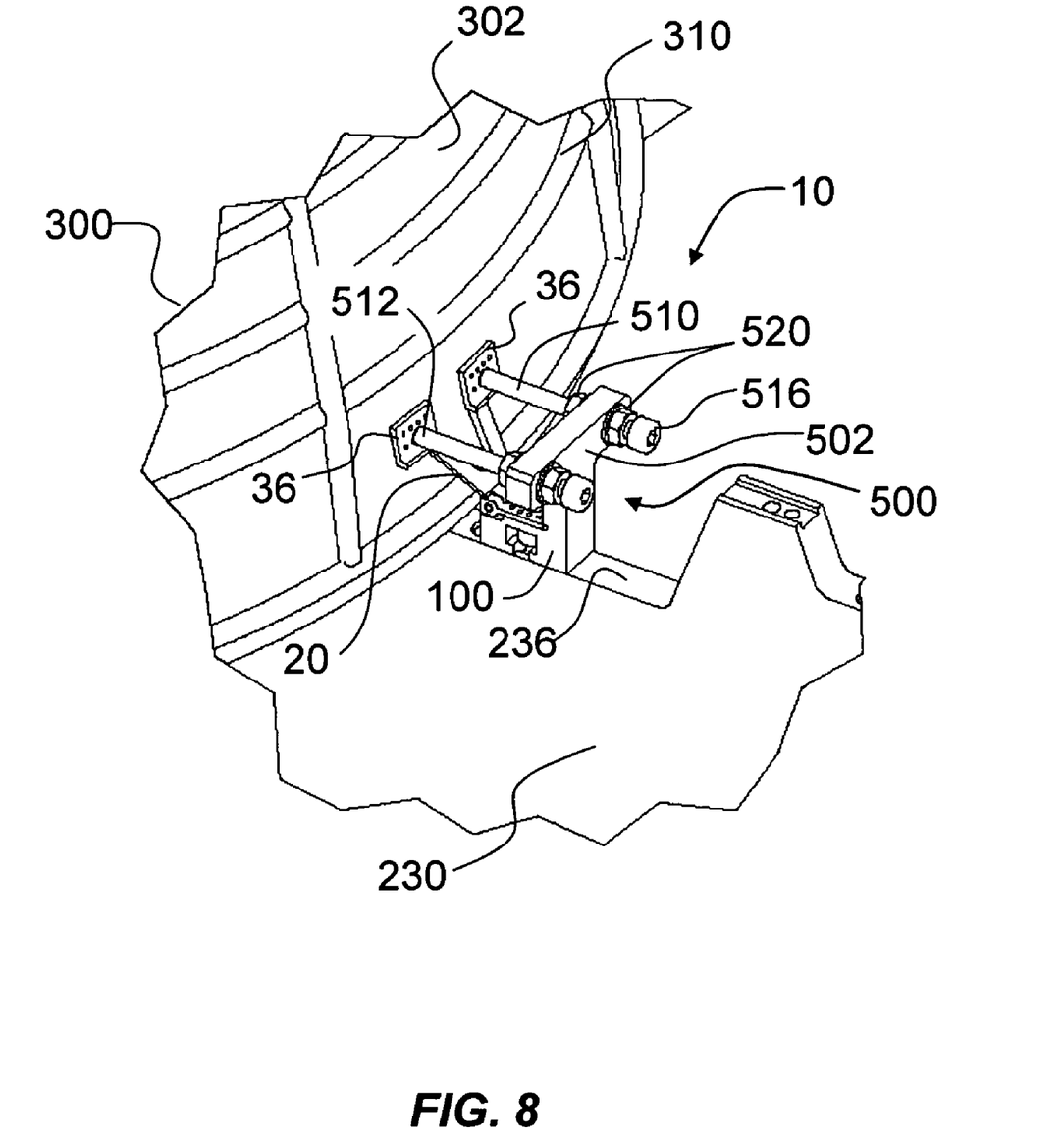
FIG. 8 is a perspective view similar to FIGS. 5A and 5B and illustrating an example adjustable clip that includes an actuator mechanism having two adjustable screws that contact the respective end pads.

FIG. 8 shows an example adjustable clip 10 incorporating an actuation mechanism 500 that allows for the clip 10 to exert a controlled amount of pressure against outer surface 302 of GIC shell 300 via end pads 36. An example actuation mechanism 500 includes a support member 502 attached to or formed integral with base 100. Support member 502 is configured to support at least one and preferably two adjustable screws 510 having ends 512 that engage end pads 36, and opposite ends 516 that are configured to be turned, e.g., by a screw-driver, allen wrench, etc. In one example, nuts 520 are used to secure screws 510 to support member 502 in a manner that allows for the screws 510 to rotate.

By adjusting the positions of screws 510 relative to support member 502, a small but controllable amount of pressure is exerted against GIC shell 300 through end pads 36, leading to at least one of a small displacement, a small deformation, or a small change in orientation of the GIC shell. This makes clips 10 adjustable, and therefore makes GIC shells 300 adjustable. In this embodiment, screws 510 serve as manually adjustable actuators.

Besides using screws 510 as adjustable actuators, other actuators can be used, such piezo electric, electromagnetic, etc. However, given that a GIC mirror is intended to be operated in a very aggressive plasma environment, and that adjustments are not often required, it is preferable to have a robust and stable actuation mechanism. Example actuation distances are between about 50 microns and 500 microns. Such adjustments, along with the preferred robustness, can satisfactorily be done using one or more screw-based actuators mechanisms as described above.

It will be apparent to those skilled in the art that various modifications and variations can be made to the present invention without departing from the spirit and scope of the invention. Thus it is intended that the present invention cover the modifications and variations of this invention provided they come within the scope of the appended claims and their equivalents.

What is claimed is:

1. An adjustable clip for securing a grazing-incident collector (GIC) shell to a spider having a spoke, comprising:
a base having an upper surface and adapted to be secured to the spoke;
a fork member having two prongs each with end pads at respective prong ends, the fork member having opposite the prong ends an end with a first hinge portion;
a hinge leaf secured to the base upper surface and having a second hinge portion operably engaged with the first hinge portion to form a hinge that allows for rotatable adjustment of the fork member relative to the base; and
the adjustable clip further includes the GIC shell having an outer surface, wherein the end pads are secured to the GIC shell outer surface so that the adjustable clip provides rigid support between the GIC shell and the spider.

2. The adjustable clip of claim 1, wherein the base is adapted to be secured to the spoke with a set screw.

3. The adjustable clip of claim 1, wherein the hinge leaf is laser welded to the base upper surface.

4. The adjustable clip of claim 1, wherein the end pads are laser welded to the GIC shell outer surface.

5. The adjustable clip of claim 1, further including a pin passing through the first and second hinge portions to maintain the first and second hinge portions in rotational engagement.

6. The adjustable clip of claim 1, further including an actuation mechanism configured to put pressure on the end pads.

7. The adjustable clip of claim 6, wherein the actuation mechanism includes two manually adjustable screws having respective ends that press against the end pads.

8. An adjustable clip for securing a grazing incidence collector (GIC) having an outer surface, comprising:
a fork member having end pads and a first hinge portion;
a base portion having an upper surface and a second hinge portion operably engaged with the first hinge portion so that the fork member is rotationally adjustable relative to the base portion; and
further including the GIC shell, wherein the end pads are laser welded to the outer surface of the GIC shell and the base portion is secured to a spider to form a rigid support between the GIC shell and the spider.

9. The adjustable clip of claim 8, further comprising:
a leaf portion secured to the base portion upper surface and that includes the second hinge portion.

10. The adjustable clip of claim 9, wherein the leaf portion is laser welded to the base portion upper surface.

11. The adjustable clip of claim 8, wherein the base portion is adapted to be secured to a spoke of a spider using a set screw.

12. The adjustable clip of claim 8, further including an actuation mechanism configured to put pressure on the end pads.

13. The adjustable clip of claim 12, wherein the actuation mechanism includes two manually adjustable screws having respective ends that press against the end pads 14. A GIC mirror, comprising:
a) one or more GIC shells each having an outer surface;
b) a spider having spokes that support the one or more GIC shells;
c) for each GIC shell, at least one adjustable clip secured to the spokes and to GIC shell outer surface, the at least one adjustable clip having:
i) a base portion having an upper surface; and
ii) a forked member having prongs with end pads, the forked member being secured to the base portion at a hinge that allows the forked member to rotate relative to the base portion prior to securing the end pads to the GIC shell outer surface, and wherein the end pads are secured to the GIC shell outer surface.

15. The GIC mirror of claim 14, further comprising first and second adjustable screws that pass through a support member secured to or formed integrally with the base portion, the first and second adjustable screws having ends that contact the respective end pads so as to apply pressure thereto.

* * * * *